(12) United States Patent
Cheng et al.

(10) Patent No.: US 9,786,727 B2
(45) Date of Patent: Oct. 10, 2017

(54) DISPLAY SUBSTRATE AND MANUFACTURING METHOD THEREOF, AND FLEXIBLE DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/024,375

(22) PCT Filed: May 23, 2014

(86) PCT No.: PCT/CN2014/078270
§ 371 (c)(1),
(2) Date: Mar. 24, 2016

(87) PCT Pub. No.: WO2015/067033
PCT Pub. Date: May 14, 2015

(65) Prior Publication Data
US 2016/0233280 A1    Aug. 11, 2016

(30) Foreign Application Priority Data
Nov. 11, 2013   (CN) .......................... 2013 1 0557263

(51) Int. Cl.
*H01L 27/32*   (2006.01)
*H01L 27/12*   (2006.01)

(52) U.S. Cl.
CPC ...... *H01L 27/3258* (2013.01); *H01L 27/1218* (2013.01); *H01L 27/1248* (2013.01);
(Continued)

(58) Field of Classification Search
CPC ............. H01L 27/3258; H01L 27/1218; H01L 27/1248; H01L 27/3246; H01L 27/3248; H01L 2227/323
See application file for complete search history.

(56) References Cited

U.S. PATENT DOCUMENTS

| 4,791,248 A | 12/1988 | Oldenettel |
| 2004/0149987 A1* | 8/2004 | Kim .................. G02F 1/136227 257/49 |

(Continued)

FOREIGN PATENT DOCUMENTS

| CN | 1372325 A | 10/2002 |
| CN | 1527115 A | 9/2004 |

(Continued)

OTHER PUBLICATIONS

International Search Report dated Aug. 5, 2014 corresponding to International application No. PCT/CN2014/078270.

(Continued)

*Primary Examiner* — Karen Kusumakar
(74) *Attorney, Agent, or Firm* — Nath, Goldberg & Meyer; Joshua B. Goldberg; Christopher Thomas

(57) ABSTRACT

The present invention provides a display substrate and a manufacturing method thereof, and a flexible display device including the display substrate, which belong to the field of display technology, and can solve the problem of poor reliability of an existing display substrate due to damage to thin film transistors when the display substrate is bent. In the display substrate provided by the present invention, by providing the stress absorbing units made of a resin material in the display substrate, the stress generated during bending of the display substrate is released through the transparent resin material and the thin film transistors on the display (Continued)

substrate are unlikely to be damaged, thereby improving the reliability of the whole display substrate.

32 Claims, 2 Drawing Sheets

(52) U.S. Cl.
CPC ...... *H01L 27/3246* (2013.01); *H01L 27/3248* (2013.01); *H01L 2227/323* (2013.01)

(56) References Cited

U.S. PATENT DOCUMENTS

| | | | | |
|---|---|---|---|---|
| 2005/0110020 | A1* | 5/2005 | Hayashi | H01L 27/12 257/72 |
| 2006/0076887 | A1 | 4/2006 | Kang | |
| 2006/0290002 | A1* | 12/2006 | Arana | H01L 21/76898 257/774 |
| 2008/0093464 | A1* | 4/2008 | Dairiki | H01L 27/1255 235/492 |
| 2008/0185588 | A1* | 8/2008 | Park | H01L 29/78603 257/59 |
| 2015/0108484 | A1* | 4/2015 | Park | H01L 27/1255 257/71 |

FOREIGN PATENT DOCUMENTS

| | | |
|---|---|---|
| CN | 101199049 A | 6/2008 |
| CN | 101330026 A | 12/2008 |
| CN | 101572037 A | 11/2009 |
| CN | 103545320 A | 1/2014 |
| EP | 1435661 A2 | 7/2004 |
| JP | 2003-255857 A | 9/2003 |
| WO | 2008/139940 A1 | 11/2008 |

OTHER PUBLICATIONS

First Office Action dated Jun. 23, 2015 corresponding to Chinese application No. 201310557263.8.
Written Opinion of the International Searching Authority dated Aug. 5, 2014 corresponding to International application No. PCT/CN2014/078270.
Extended European Search Report dated Apr. 4, 2017 issued in corresponding European Patent Application 14860820.1.

* cited by examiner

DISPLAY SUBSTRATE AND MANUFACTURING METHOD THEREOF, AND FLEXIBLE DISPLAY DEVICE

This is a National Phase application filed under 35 U.S.C. 371 as a national stage of PCT/CN2014/078270, filed May 23, 2014, and claiming the benefit from Chinese Application No. 201310557263.8, filed Nov. 11, 2013, the content of which is hereby incorporated by reference in its entirety.

FIELD OF THE INVENTION

The present invention belongs to the field of display technology, and particularly relates to a display substrate and a manufacturing method thereof, and a flexible display device including the display substrate.

BACKGROUND OF THE INVENTION

Flexible display devices have many advantages, such as impact resistance, high shock resistance, light weight, small volume, and portability. At present, main flexible display materials may be roughly classified into three types: electronic paper (or flexible electrophoretic display), flexible organic light-emitting diodes (OLEDs) and flexible liquid crystals.

A flexible display device comprises a display substrate, which includes a flexible base substrate and a structure located on the flexible base substrate, wherein the flexible base substrate is a polyimide (PI) base substrate, a polyethylene glycol terephthalate (PET) base substrate, or the like; and the structure on the flexible base substrate comprises thin film transistors and insulating layers, and the insulating layers are used for protecting the thin film transistors, so as to prevent the thin film transistors from being damaged when the display substrate is bent. An array substrate of a flexible display device in the prior art usually adopts insulating layers, such as a gate insulating layer, an interlayer insulating layer and a passivation layer. The foregoing insulating layers are generally made of $SiN_x$ or $SiO_x$, which causes poor toughness of the insulating layers, and therefore, the insulating layers are apt to fracture when the flexible display device is bent, so that the thin film transistors on the display substrate of the flexible display device are likely to be damaged. For example, as for a thin film transistor (TFT) structure for controlling display of a pixel, accumulation of stress generated when the flexible display device is bent may result in fracture of the insulating layers, which certainly influences performance of the TFT, thereby influencing reliability of the flexible display device and adversely affecting display quality.

SUMMARY OF THE INVENTION

An object of the present invention is to solve the problem of poor reliability of a display substrate in the prior art due to damage to thin film transistors when the display substrate is bent, and to provide a display substrate having high reliability.

A technical solution employed to solve the technical problem of the present invention is a display substrate, comprising: a base substrate and a thin film transistor arranged on the base substrate, wherein the display substrate further comprises a stress absorbing unit disposed around the thin film transistor; and the stress absorbing unit comprises a horizontal portion at least located above the thin film transistor, and a vertical portion located outside at least one side of the thin film transistor.

Preferably, the horizontal portion is connected with the vertical portion; and the vertical portion is in contact with the base substrate.

Preferably, the base substrate is provided thereon with a plurality of insulating layers: one of the insulating layers is provided with a via hole; and the vertical portion is arranged in the via hole. In such case, the horizontal portion may be arranged in a groove of said one of the insulating layers provided with the via hole, or on said one of the insulating layers.

Preferably, the base substrate is provided thereon with a plurality of insulating layers; more than one of the insulating layers is provided with a via hole: and the vertical portion is arranged in the via hole. In such case, the horizontal portion may be arranged in a groove of the uppermost insulating layer of said more than one of the insulating layers provided with the via hole, or on the uppermost insulating layer.

Preferably, the horizontal portions of the stress absorbing units around different thin film transistors are connected into a whole.

Preferably, the plurality of insulating layers are a gate insulating layer, an interlayer insulating layer and a first passivation layer sequentially disposed on the base substrate. In such case, the horizontal portion may be arranged in a groove of the first passivation layer, or arranged on the first passivation layer.

Preferably, the plurality of insulating layers are a gate insulating layer, an interlayer insulating layer, a first passivation layer and a planarization layer sequentially disposed on the base substrate. In such case, the horizontal portion may be arranged in a groove of the planarization layer, or arranged on the planarization layer.

Preferably, the display substrate further comprises a pixel defining layer located above the thin film transistor, and the pixel defining layer is the horizontal portion.

Preferably, the display substrate further comprises an anode electrically connected to a drain of the thin film transistor, and a light-emitting layer and a cathode sequentially arranged on the anode; an overlapping region of the anode, wherein the light-emitting layer and the cathode forms a light-emitting region; and a pixel defining layer is arranged above the thin film transistor.

Preferably, material of the stress absorbing units is a resin material.

Preferably, the resin material is acrylic resin or polyimide resin.

Another object of the present invention is to provide a manufacturing method of a display substrate, comprising steps of: disposing a thin film transistor on a base substrate; and disposing a stress absorbing unit around the thin film transistor, so that a horizontal portion of the stress absorbing unit is at least located above the thin film transistor, and a vertical portion of the stress absorbing unit is located outside a side of the thin film transistor.

Preferably, the step of disposing a thin film transistor on a base substrate comprises: forming an active layer, a gate insulating layer, a gate, an interlayer insulating layer, a source, a drain and a first passivation layer on the base substrate; and the step of disposing a stress absorbing units around the thin film transistor comprises: forming, outside at least one side of the thin film transistor, a via hole in the first passivation layer, the interlayer insulating layer and the gate insulating layer by a patterning process, forming a groove, which is used for accommodating the horizontal portion of the stress absorbing unit and is connected with the via hole, in the first passivation layer by a patterning process, and forming a resin material in the via hole and the groove to form the vertical portion and the horizontal portion of the stress absorbing unit.

Preferably, the step of disposing a thin film transistor on a base substrate comprises: forming an active layer, a gate insulating layer, a gate, an interlayer insulating layer, a source, a drain and a first passivation layer on the base substrate: and the step of disposing a stress absorbing unit around the thin film transistor comprises: forming, outside at least one side of the thin film transistor, a via hole in the first passivation layer, the interlayer insulating layer and the gate insulating layer by a patterning process, and forming a resin material in the via hole and on the first passivation layer to form the vertical portion and the horizontal portion of the stress absorbing unit.

Preferably, the step of disposing a thin film transistor on a base substrate comprises: forming an active layer, a gate insulating layer, a gate, an interlayer insulating layer, a source, a drain, a first passivation layer and a planarization layer on the base substrate: and the step of disposing a stress absorbing unit around the thin film transistor comprises: forming, outside at least one side of the thin film transistor, a via hole in the planarization layer, the first passivation layer, the interlayer insulating layer and the gate insulating layer by a patterning process, forming a groove, which is used for accommodating the horizontal portion of the stress absorbing unit and is connected with the via hole, in the planarization layer by a patterning process, and forming a resin material in the via hole and the groove to form the vertical portion and the horizontal portion of the stress absorbing unit.

Preferably, the step of disposing a thin film transistor on a base substrate comprises: forming an active layer, a gate insulating layer, a gate, an interlayer insulating layer, a source, a drain, a first passivation layer and a planarization layer on the base substrate: and the step of disposing a stress absorbing unit around the thin film transistor comprises: forming, outside at least one side of the thin film transistor, a via hole in the planarization layer, the first passivation layer, the interlayer insulating layer and the gate insulating layer by a patterning process, and forming a resin material in the via hole and on the planarization layer to form the vertical portion and the horizontal portion of the stress absorbing unit.

Preferably, the method further comprises: forming a via hole in each layer on the drain, and forming, by a patterning process, an anode electrically connected to the drain through the via hole: forming a pixel defining layer, an organic light-emitting layer and a cathode; and packaging the display substrate.

Preferably, the step of disposing a thin film transistor on a base substrate comprises: forming an active layer, a gate insulating layer, a gate, an interlayer insulating layer, a source, a drain and a first passivation layer on the base substrate, forming a via hole in the first passivation layer on the drain, and forming, by a patterning process, an anode electrically connected to the drain through the via hole; and the step of disposing a stress absorbing unit around the thin film transistors comprise: forming, outside at least one side of the thin film transistor, a via hole in the first passivation layer, the interlayer insulating layer and the gate insulating layer by a patterning process, forming a resin material in the via hole to form the vertical portion of the stress absorbing unit, and forming a resin material on the first passivation layer and the anode to form a pixel defining layer serving as the horizontal portion of the stress absorbing unit.

Preferably, the method further comprises: forming an organic light-emitting layer and a cathode; and packaging the display substrate.

Another object of the present invention is to provide a flexible display device, which comprises the above-mentioned display substrate.

In the display substrate provided by the present invention, by providing the stress absorbing units made of a resin material in the display substrate, the stress generated during bending of the display substrate is released through the transparent resin material and the thin film transistors on the display substrate are unlikely to be damaged, thereby improving the reliability of the whole display substrate.

The above-mentioned display substrate has relatively high reliability, so that the reliability of the whole flexible display device is improved.

REFERENCE NUMERALS

1—Base substrate: 2—Gate insulating layer; 3—Interlayer insulating layer; 4—First passivation layer; 5—Gate; 6—Drain; 7—Active layer; 8—Source; 9—Stress absorbing unit; 91—Vertical portion of stress absorbing unit: 92—Horizontal portion of stress absorbing unit: 10—Anode: 11—Light-emitting layer; 12—Cathode: 13—Second passivation layer; 14—Thin film layer: 15—Pixel defining layer; 16—Light-emitting region; and 17—Planarization layer.

DETAILED DESCRIPTION OF THE EMBODIMENTS

In order to make those skilled in the art better understand the technical solutions of the present invention, the present invention will be further described in details below with reference to the accompanying drawings and specific implementations.

Embodiment 1

Figure 1:
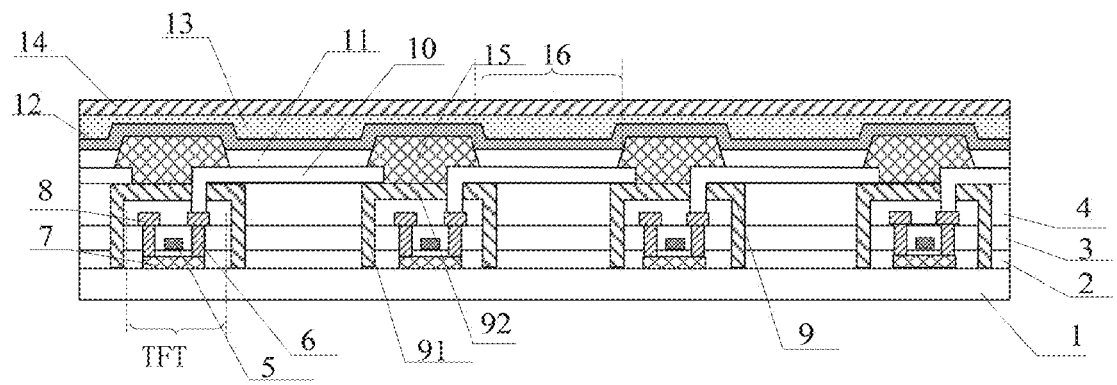
FIG. 1 is a schematic cross-sectional diagram of a display substrate in which a horizontal portion of a stress absorbing unit is disposed in a groove of a first passivation layer and a vertical portion of the stress absorbing unit is located outside two sides of the TFT in Embodiment 1.

As shown in FIG. 1, this embodiment provides a display substrate, comprising: a base substrate 1 and thin film transistors arranged on the base substrate 1, and the display substrate further comprises stress absorbing units 9 respectively disposed around the thin film transistors; and the stress absorbing unit 9 comprises a horizontal portion 92 located above the thin film transistor, and a vertical portion 91 located outside a side of the thin film transistor.

The stress absorbing unit 9 is made of a resin material, the resin material is acrylic resin, or may be other resin having elastic deformation capability such as polyimide resin. When the base substrate 1 is bent, the stress absorbing unit 9 is elastically deformed to absorb the stress accumulated when the base substrate 1 is deformed, so as to prevent the TFT and similar devices from being damaged and ensure reliability of the devices.

The base substrate 1 may be a polyimide (PI) base substrate, or a polyethylene glycol terephthalate (PET) base substrate, i.e., a base substrate having certain flexibility.

The horizontal portion 92 of the stress absorbing unit 9 is connected to the vertical portion 91 of the stress absorbing unit 9: and the vertical portion 91 is in contact with the base substrate 1.

The TFT in this embodiment adopts a top-gate structure, and comprises a source 8, a drain 6, an active layer 7, a gate 5, etc. Of course, the TFT may adopt a bottom-gate structure.

The display substrate in this embodiment may be an organic light-emitting diode display substrate, a liquid crystal display substrate, or an electronic paper display substrate, etc.

The display substrate in this embodiment further comprises an anode 10 electrically connected to the drain 6 of the TFT, and a light-emitting layer 11 and a cathode 12 are sequentially arranged on the anode 10; and an overlapping region of the anode 10, the light-emitting layer 11 and the cathode 12 forms a light-emitting region 16. A second passivation layer 13 and a thin film layer 14 may be further provided on the cathode 12 sequentially. The display substrate may further comprise a pixel defining layer 15 located above the thin film transistor.

In this embodiment, the anode 10 of an organic light-emitting diode is electrically connected to the drain 6 of the TFT: of course, a structure in which the cathode of the organic light-emitting diode is electrically connected to the drain of the TFT may be employed, and the organic light-emitting diode having such structure is an inverted organic light-emitting diode.

The base substrate 1 is provided thereon with a plurality of insulating layers, such as a gate insulating layer 2, an interlayer insulating layer 3 and a first passivation layer 4 which are sequentially arranged; a via hole is provided in one or more of the insulating layers: and the vertical portion 91 of the stress absorbing unit 9 is arranged in the via hole. For example, a via hole is provided in the gate insulating layer 2, the interlayer insulating layer 3 and the first passivation layer 4: and the vertical portion 91 of the stress absorbing unit 9 is arranged in the via hole.

The plurality of insulating layers are generally made of $SiN_x$ or $SiO_x$ and thus have poor toughness. A specific configuration of the plurality of insulating layers may be different in different types of display substrates, and the number of the insulating layers may be more than or less than three.

The horizontal portion 92 of the stress absorbing unit 9 is arranged in a groove of one of the insulating layers that is provided with the via hole, or in a groove of the uppermost insulating layer of the insulating layers that are provided with the via hole. As shown in FIG. 1, the stress absorbing unit 9 comprises the horizontal portion 92 located above the TFT, and the vertical portion 91 located outside two sides of the TFT. Here, the horizontal portion 92 is disposed in a groove of the first passivation layer 4. That is to say, during a manufacturing process, the first passivation layer 4 is etched to form a groove for accommodating the horizontal portion 92, a layer of resin material is then formed in the groove to form the horizontal portion 92 of the stress absorbing unit 9, and the vertical portion 91 of the stress absorbing unit 9 is formed in the via hole; and the via hole and the groove are connected with each other. The horizontal portion 92 may be disposed in a groove of other insulating layer, for example, the horizontal portion 92 may be disposed in a groove of the gate insulating layer 2 or/and the interlayer insulating layer 3.

In the display substrate as shown in FIG. 1, the horizontal portions of the stress absorbing units 9 are separated and disconnected from each other. However, the present invention is not limited thereto, the horizontal portions 92 of the stress absorbing units 9 around different thin film transistors may be connected into a whole, for example, the horizontal portions 92 of the stress absorbing units 91 around two thin film transistors are connected into a whole, the horizontal portions 92 of the stress absorbing units 91 around five thin film transistors are connected into a whole, the horizontal portions 92 of the stress absorbing units 91 around eight thin film transistors are connected into a whole, and so on, which are not listed here one by one.

Embodiment 2

Figure 2:
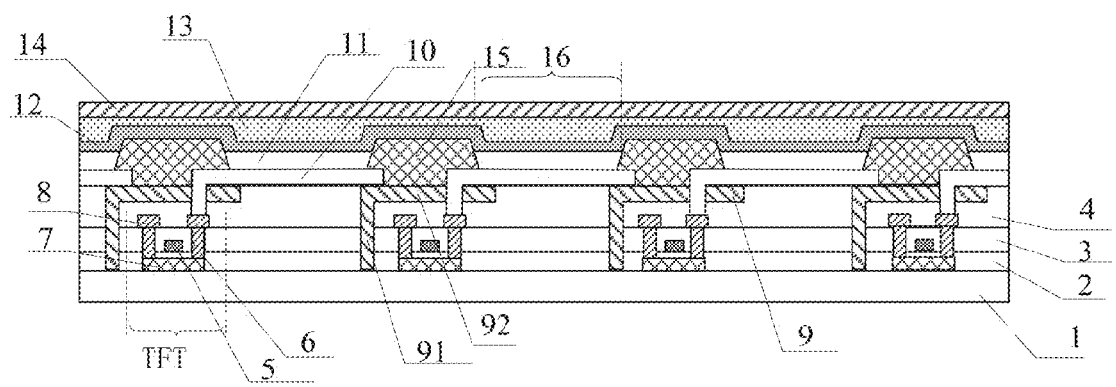
FIG. 2 is a schematic cross-sectional diagram of a display substrate in which a horizontal portion of a stress absorbing unit is disposed in a groove of a first passivation layer and a vertical portion of the stress absorbing unit is located outside one side of the TFT in Embodiment 2.

FIG. 2 shows a cross-sectional diagram of a display substrate according to Embodiment 2 of the present invention. The display substrate as shown in FIG. 2 differs from the display substrate in Embodiment 1 as shown in FIG. 1 in that the vertical portion 91 of the stress absorbing unit 9 is disposed outside only one side of the thin film transistor. Other structures of the display substrate in Embodiment 2 are the same as those in Embodiment 1, and thus the description thereof is omitted here.

In the display substrate as shown in FIG. 2, the horizontal portions of the stress absorbing units 9 are separated and disconnected from each other. However, the present invention is not limited thereto, the horizontal portions 92 of the stress absorbing units 9 around different thin film transistors may be connected into a whole, for example, the horizontal portions 92 of the stress absorbing units 91 around two thin film transistors are connected into a whole, the horizontal portions 92 of the stress absorbing units 91 around five thin film transistors are connected into a whole, the horizontal portions 92 of the stress absorbing units 91 around eight thin film transistors are connected into a whole, and so on, which are not listed here one by one.

Embodiment 3

The display substrate in Embodiment 3 differs from the display substrate in Embodiment 2 in that the horizontal portion 92 of the stress absorbing unit 9 is disposed on the first passivation layer 4, and the horizontal portions 92 of the stress absorbing units 9 around all thin film transistors are connected into a whole. Other structures of the display substrate in Embodiment 3 are the same as those in Embodiment 2, and thus the description thereof is omitted here.

Of course, in the display substrate of the present invention, the horizontal portion of the stress absorbing unit may be arranged on one of the insulating layers that is provided with the via hole, or arranged on the uppermost insulating layer of the more than one of the insulating layers that are provided with the via hole.

Figure 3:
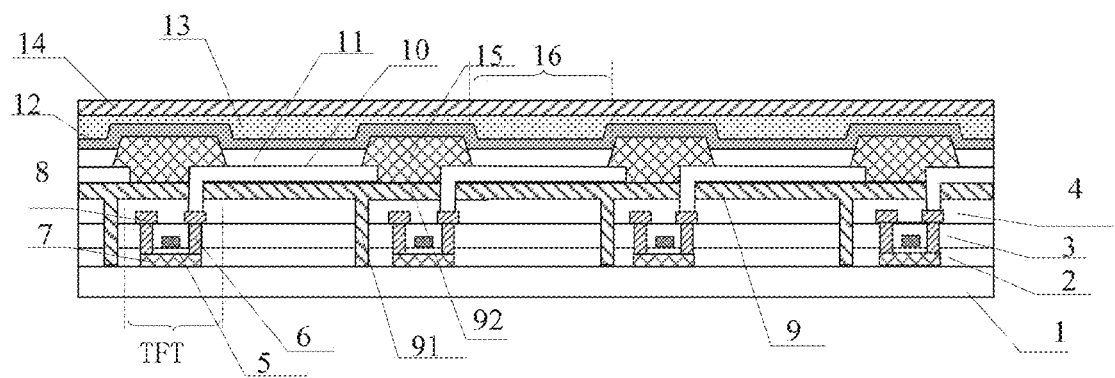
FIG. 3 is a schematic cross-sectional diagram of a display substrate in which a horizontal portion of a stress absorbing unit is disposed on a first passivation layer, the horizontal portions of the stress absorbing units around different thin film transistors are connected into a whole, and a vertical portion of the stress absorbing unit is located outside one side of the TFT in Embodiment 3.

As shown in FIG. 3, the horizontal portion 92 of the stress absorbing unit 9 is disposed on the first passivation layer 4. During a manufacturing process, a layer of resin material is formed on the first passivation layer 4 to form the horizontal portion 92 of the stress absorbing unit 9, and the vertical portion 91 of the stress absorbing unit is formed in the via hole. In Embodiment 3, the horizontal portions 92 of the stress absorbing units 9 around all thin film transistors may be connected into a whole. For example, the horizontal portions 92 of the stress absorbing units 91 around two thin film transistors are connected into a whole, the horizontal portions 92 of the stress absorbing units 91 around five thin film transistors are connected into a whole, the horizontal portions 92 of the stress absorbing units 91 around eight thin film transistors are connected into a whole, and so no, which are not listed here one by one. Of course, the horizontal portions 92 of the stress absorbing units 91 around different thin film transistors may be disconnected from each other.

Embodiment 4

Figure 4:
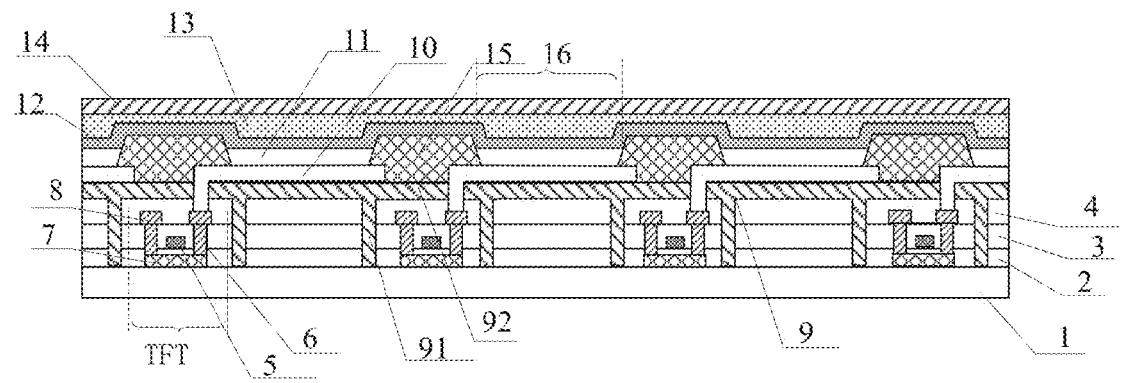
FIG. 4 is a schematic cross-sectional diagram of a display substrate in which a horizontal portion of a stress absorbing unit is disposed on a first passivation layer, and the horizontal portions of the stress absorbing units around different thin film transistors are connected into a whole, and a vertical portion of the stress absorbing unit is located outside two sides of the TFT in Embodiment 4.

FIG. 4 shows a cross-sectional diagram of a display substrate according to Embodiment 4 of the present invention. The display substrate as shown in FIG. 4 differs from the display substrate in Embodiment 3 as shown in FIG. 3 in that the vertical portion 91 of the stress absorbing unit 9 is disposed outside two sides of the thin film transistor. Other structures of the display substrate in Embodiment 4 are the same as those in Embodiment 3, and thus the description thereof is omitted here.

In the display substrate as shown in FIG. 4, the horizontal portions 92 of the stress absorbing units 9 around different thin film transistors may be connected into a whole, for example, the horizontal portions 92 of the stress absorbing units 91 around two thin film transistors are connected into a whole, the horizontal portions 92 of the stress absorbing units 91 around five thin film transistors are connected into a whole, the horizontal portions 92 of the stress absorbing units 91 around eight thin film transistors are connected into a whole, and so on, which are not listed here one by one. Of course, the horizontal portions 92 of the stress absorbing units 91 around different thin film transistors may be disconnected from each other.

Embodiment 5

Figure 5:
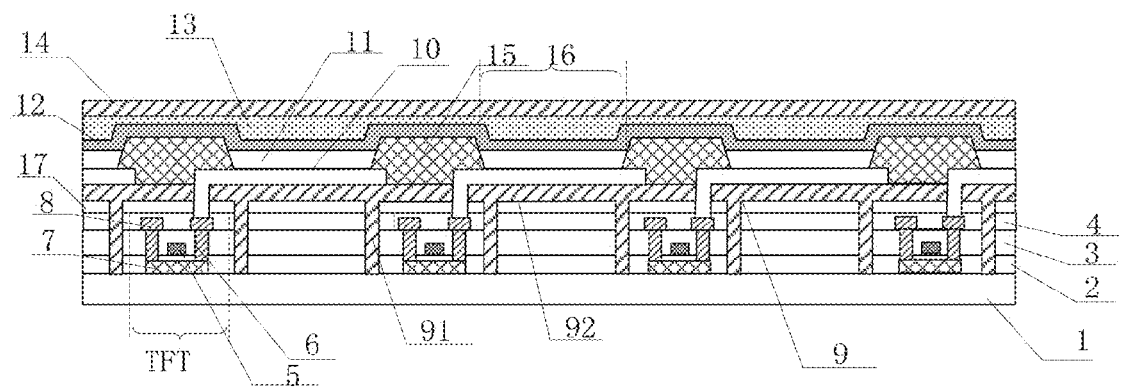
FIG. 5 is a schematic cross-sectional diagram of a display substrate in which a horizontal portion of a stress absorbing unit is disposed on a planarization layer, the horizontal portions of the stress absorbing units around different thin film transistors are connected into a whole, and a vertical portion of the stress absorbing unit is located outside two sides of the TFT in Embodiment 5.

The display substrate in this embodiment further comprises a planarization layer 17, as shown in FIG. 5, the gate insulating layer 2, the interlayer insulating layer 3, the first passivation layer 4 and the planarization layer 17 are sequentially disposed on the base substrate 1. A via hole is provided in the gate insulating layer 2, the interlayer insulating layer 3, the first passivation layer 4 and the planarization layer 17; and the vertical portion 91 of the stress absorbing unit 9 is disposed in the via hole. The horizontal portion 92 of the stress absorbing unit is disposed on the planarization layer 17. During a manufacturing process, a layer of resin material is formed on the planarization layer 17 to form the horizontal portion 92 of the stress absorbing unit 9, and the vertical portion 91 of the stress absorbing unit is formed in the via hole; and the horizontal portions 92 of the stress absorbing units around different thin film transistors are connected into a whole. For example, the horizontal portions 92 of the stress absorbing units 91 around two thin film transistors are connected into a whole, the horizontal portions 92 of the stress absorbing units 91 around five thin film transistors are connected into a whole, the horizontal portions 92 of the stress absorbing units 91 around eight thin film transistors are connected into a whole, and so on, which are not listed here one by one. Of course, the horizontal portions 92 of the stress absorbing units 91 around different thin film transistors may be disconnected from each other.

It should be understood that the horizontal portion 92 of the stress absorbing unit 9 may be disposed in a groove of the planarization layer 17: during a manufacturing process, the planarization layer 17 is etched to form a groove for accommodating the horizontal portion 92, a layer of resin material is then formed in the groove to form the horizontal portion 92 of the stress absorbing unit 9, and the vertical portion 91 of the stress absorbing unit 9 is formed in the via hole; and the via hole and the groove are connected with each other.

In this embodiment, the vertical portion 91 of the stress absorbing unit 9 is arranged outside two sides of the thin film transistor, but the present invention is not limited thereto, and the vertical portion 91 may be arranged outside one side of the thin film transistor.

Embodiment 6

Figure 6:
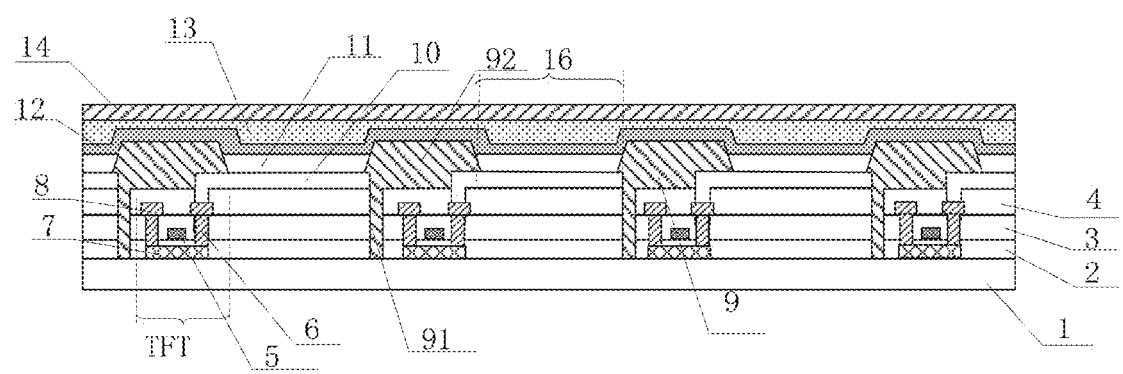
FIG. 6 is a schematic cross-sectional diagram of a display substrate in which a horizontal portion of a stress absorbing unit is a pixel defining layer and a vertical portion of the stress absorbing unit is located outside one side of the TFT in Embodiment 6.

In this embodiment as shown in FIG. 6, the pixel defining layer 15 also serves as the horizontal portion 92 of the stress absorbing unit, and the vertical portion 91 of the stress absorbing unit 9 may be arranged outside a side of the TFT. In FIG. 6, the vertical portion 91 of the stress absorbing unit 9 is arranged outside one side of the TFT, and of course, the object of the present invention can also be achieved by arranging the vertical portion 91 of the stress absorbing unit 9 outside two sides of the TFT. The pixel defining layer 15 is made of a resin material.

Shape of cross section of the via hole is not limited in the present invention, and may be any one of rectangle, circle, ellipse and polygon.

The stress absorbing unit 9 is made of a resin material, the resin material is acrylic resin, and preferably, the resin material may be other resin having elastic deformation capability, such as polyimide resin. When the base substrate 1 is bent, the stress absorbing units 9 are elastically deformed to absorb the stress accumulated when the base substrate 1 is deformed, so as to prevent the TFT and similar devices from being damaged and ensure reliability of the devices.

Embodiment 7

This embodiment provides a manufacturing method of a display substrate, comprising: disposing thin film transistors on a base substrate: and disposing stress absorbing units around the thin film transistors, respectively, so that a horizontal portion of the stress absorbing unit is at least located on a horizontal part above the thin film transistor, and a vertical portion of the stress absorbing unit is located outside a side of the thin film transistor.

The display substrates as shown in FIGS. 1 and 2 may be manufactured by using the method described below. Step 1, an active layer 7, a gate insulating layer 2, a gate 5, an interlayer insulating layer 3, a source 8, a drain 6 and a first passivation layer 4 are formed on a base substrate 1. The methods for forming the foregoing layers are the same as those for forming a TFT of a conventional display substrate, and thus will not be repeated here.

Next, a via hole is formed, outside at least one side of the TFT, in the first passivation layer 4, the interlayer insulating layer 3 and the gate insulating layer 2 by a patterning process, and the shape of cross section of the via hole may be any one of rectangle, circle, ellipse and polygon.

Then, a groove for accommodating the horizontal portion 92 of the stress absorbing unit 9 is formed in the first passivation layer 4 by a patterning process, and the via hole and the groove are connected with each other.

Then, a layer of resin material is formed in the groove, so as to form the horizontal portion 92 of the stress absorbing unit 9 in the groove and form the vertical proportion 91 of the stress absorbing unit in the via hole. To forme the layer of resin material in the groove, ink-jet printing may be performed to form a layer of resin material in the groove; alternatively, a layer of photosensitive resin material is coated on the first passivation layer, and the photosensitive resin material is exposed and developed to remove the photosensitive resin material which is not in the groove, so as to form a layer of photosensitive resin material in the groove. In this step, the vertical portion 91 and the horizontal portion 92 of the stress absorbing unit may be formed at the same time, or the vertical portion 91 may be formed by filling a resin material before the horizontal portion 92 is formed.

Step 2, a via hole is formed in the first passivation layer 4 and the horizontal portion 92 of the stress absorbing unit 9 that are on the drain 6, an anode 10 is formed by a patterning process, and the anode 10 is electrically connected to the drain 6 through the via hole. The methods for forming the via hole and the anode 10 belong to the prior art and thus will not be repeated here.

Step 3, a pixel defining layer 15, an organic light-emitting (EL) layer 11 and a cathode 12 are formed, and the methods for forming the foregoing layers belong to the prior art and thus will not be repeated here.

Step 4, a second passivation layer 13 is formed on the cathode 12, a thin film layer 14 is formed on the second passivation layer 13, and the whole display substrate is packaged by a thin film encapsulation method.

Of course, the second passivation layer 13 may be coated with an adhesive, and a second substrate may be bonded through the adhesive to package the display substrate.

The display substrates as shown in FIGS. 3 and 4 may be manufactured by using the method described below.

Step 1, an active layer 7, a gate insulating layer 2, a gate 5, an interlayer insulating layer 3, a source 8, a drain 6 and a first passivation layer 4 are formed on a base substrate 1. The methods for forming the foregoing layers are the same as those for forming a TFT of a conventional display substrate, and thus will not be repeated here.

Next, a via hole is formed, outside at least one side of the TFT, in the first passivation layer 4, the interlayer insulating layer 3 and the gate insulating layer 2 by a patterning process, and the shape of cross section of the via hole may be any one of rectangle, circle, ellipse and polygon.

Then, a layer of resin material is formed on the first passivation layer 4, so as to form the horizontal portion 92 of the stress absorbing unit 9 on the first passivation layer 4 and form the vertical proportion 91 of the stress absorbing unit in the via hole. For example, a layer of resin material is formed on the first passivation layer 4 by means of screen printing, spin coating or the like. In this step, the vertical portion 91 and the horizontal portion 92 of the stress absorbing unit may be formed at the same time, or the vertical portion 91 is formed by filling a resin material before the horizontal portion 92 is formed.

Step 2, a via hole is formed in the first passivation layer 4 and the horizontal portion 92 of the stress absorbing unit 9 that are on the drain 6, an anode 10 is formed by a patterning process, and the anode 10 is electrically connected to the drain 6 through the via hole. The methods for forming the via hole and the anode 10 belong to the prior art and thus will not be repeated here.

Step 3, a pixel defining layer 15, an organic light-emitting (EL) layer 11 and a cathode 12 are formed, and the methods for forming the foregoing layers belong to the prior art and thus will not be repeated here.

Step 4, a second passivation layer 13 is formed on the cathode 12, a thin film layer 14 is formed on the second passivation layer 13, and the whole display substrate is packaged by a thin film encapsulation method.

Of course, the second passivation layer 13 may be coated thereon with an adhesive, and a second substrate may be bonded through the adhesive to package the display substrate.

The display substrate as shown in FIG. 5 may be manufactured by using the method described below.

Step 1, an active layer 7, a gate insulating layer 2, a gate 5, an interlayer insulating layer 3, a source 8, a drain 6, a first passivation layer 4 and a planarization layer 17 are formed on a base substrate 1. The methods for forming the foregoing layers are the same as those for forming a TFT of a conventional display substrate, and thus will not be repeated here.

Next, a via hole is formed, outside at least one of the sides of the TFT, in the planarization layer 17, the first passivation layer 4, the interlayer insulating layer 3 and the gate insulating layer 2 by a patterning process, and the shape of cross section of the via hole may be any one of rectangle, circle, ellipse and polygon.

Then, a layer of resin material is formed on the planarization layer 17, so as to form the horizontal portion 92 of the stress absorbing unit 9 on the planarization layer 17 and form the vertical proportion 91 of the stress absorbing unit in the via hole. For example, a layer of resin material is formed on the planarization layer 17 by means of screen printing, spin coating, or the like. In this step, the vertical portion 91 and the horizontal portion 92 of the stress absorbing unit may be formed at the same time, or the vertical portion 91 is formed by filling a resin material before the horizontal portion 92 is formed.

Step 2, a via hole is formed in the first passivation layer 4, the planarization layer 17 and the horizontal portion 92 of the stress absorbing unit 9 that are on the drain 6, an anode 10 is formed by a patterning process, and the anode 10 is electrically connected to the drain 6 through the via hole. The methods for forming the via hole and the anode 10 belong to the prior art and thus will not be repeated here.

Step 3, a pixel defining layer 15, an organic light-emitting (EL) layer 11 and a cathode 12 are formed, and the methods for forming the foregoing layers belong to the prior art and thus will not be repeated here.

Step 4, a second passivation layer 13 is formed on the cathode 12, a thin film layer 14 is formed on the second passivation layer 13, and the whole display substrate is packaged by a thin film encapsulation method.

Of course, the second passivation layer 13 may be coated with an adhesive, and a second substrate may be bonded through the adhesive to package the display substrate.

The display substrate as shown in FIG. 6 may be manufactured by the method described below.

Step 1, an active layer 7, a gate insulating layer 2, a gate 5, an interlayer insulating layer 3, a source 8, a drain 6 and a first passivation layer 4 are formed on a base substrate 1. The methods for forming the foregoing layers are the same as those for forming a TFT of a conventional display substrate, and thus will not be repeated here.

Step 2, a via hole is formed in the first passivation layer 4 on the drain 6, an anode 10 is formed by a patterning process, and the anode 10 is electrically connected to the drain 6 through the via hole. The methods for forming the via hole and the anode 10 belong to the prior art and thus will not be repeated here.

Step 3, a via hole is formed, outside at least one side of the TFT, in the first passivation layer 4, the interlayer insulating layer 3 and the gate insulating layer 2 by a patterning process, and the shape of cross section of the via hole may be any one of rectangle, circle, ellipse and polygon.

Then, a pixel defining layer 15 is formed on the first passivation layer 4 and the anode 10 by using a resin material, the pixel defining layer 15 serves as the horizontal portion 92 of the stress absorbing unit 9, and at the same time, the vertical proportion 91 of the stress absorbing unit is formed in the via hole. To form the pixel defining layer 15 by using a resin material, a photosensitive resin material may be coated, and then exposed and developed to form the pixel defining layer 15. In this step, the vertical portion 91 of the stress absorbing unit and the pixel defining layer 15 serving as the horizontal portion may be formed at the same time, or the vertical portion 91 may be formed by filling a resin material before the pixel defining layer 15 is formed.

Then, an organic light-emitting (EL) layer 11 and a cathode 12 are formed, and the methods for forming the foregoing layers belong to the prior art and thus will not be repeated herein.

Step 4, a second passivation layer 13 is formed on the cathode 12, a thin film layer 14 is formed on the second passivation layer 13, and the whole display substrate is packaged by a thin film encapsulation method.

Of course, the second passivation layer 13 may be coated with an adhesive, and a second substrate may be bonded through the adhesive to package the display substrate

Embodiment 8

This embodiment provides a flexible display device, including the above-mentioned display substrate. Preferably, the display substrate included in the flexible display device is a flexible organic light-emitting diode display substrate.

It should be understood that the foregoing implementations are merely exemplary implementations adopted for describing the principle of the present invention, but the present invention is not limited thereto. Those of ordinary skill in the art may make various variations and improvements without departing from the spirit and essence of the present invention, and these variations and improvements shall be considered to fall into the protection scope of the present invention.

The invention claimed is:

1. A display substrate, comprising: a base substrate and a thin film transistor arranged on the base substrate, wherein the display substrate further comprises a stress absorbing unit disposed around the thin film transistor and spaced apart from the thin film transistor; and the stress absorbing unit comprises a horizontal portion at least located above the thin film transistor, and a vertical portion located outside at least one side of the thin film transistor,
  wherein the base substrate is provided thereon with a plurality of insulting layers, and
  wherein the plurality of insulating layers are a gate insulating layer, an interlayer insulating layer, and a first passivation layer, sequentially disposed on the base substrate.

2. The display substrate according to claim 1, wherein the horizontal portion is connected with the vertical portion; and the vertical portion is in contact with the base substrate.

3. The display substrate according to claim 1, wherein one of the insulating layers is provided with a via hole; and the vertical portion is arranged in the via hole.

4. The display substrate according to claim 1, wherein more than one of the insulating layers is provided with a via hole; and the vertical portion is arranged in the via hole.

5. The display substrate according to claim 3, wherein the horizontal portion is arranged in a groove of said one of the insulating layers provided with the via hole, or on said one of the insulating layers.

6. The display substrate according to claim 4, wherein the horizontal portion is arranged in a groove of the uppermost insulating layer of said more than one of the insulating layers provided with the via hole, or on the uppermost insulating layer.

7. The display substrate according to claim 5, wherein the horizontal portions of the stress absorbing units around different thin film transistors are connected into a whole.

8. The display substrate according to claim 1, wherein the horizontal portion is arranged in a groove of the first passivation layer, or arranged on the first passivation layer.

9. The display substrate according to claim 1, further comprising a pixel defining layer located above the thin film transistor, and the pixel defining layer is the horizontal portion.

10. The display substrate according to claim 1, wherein material of the stress absorbing units is a resin material.

11. The display substrate according to claim 10, wherein the resin material is acrylic resin or polyimide resin.

12. A manufacturing method of a display substrate of claim 1, comprising steps of:
  disposing a thin film transistor on a base substrate; and
  disposing a stress absorbing unit around the thin film transistor and spaced apart from the thin film transistor, so that a horizontal portion of the stress absorbing unit is at least located above the thin film transistor, and a vertical portion of the stress absorbing unit is located outside a side of the thin film transistor.

13. A manufacturing method according to claim 12, wherein
  the step of disposing a thin film transistor on a base substrate comprises: forming an active layer, a gate insulating layer, a gate, an interlayer insulating layer, a source, a drain and a first passivation layer on the base substrate; and the step of disposing a stress absorbing unit around the thin film transistor comprises: forming, outside at least one side of the thin film transistor, a via hole in the first passivation layer, the interlayer insulating layer and the gate insulating layer by a patterning process, forming a groove, which is used for accommodating the horizontal portion of the stress absorbing unit and is connected with the via hole, in the first passivation layer by a patterning process, and forming a resin material in the via hole and the groove to form the vertical portion and the horizontal portion of the stress absorbing unit; or wherein the step of disposing a thin film transistor on a base substrate comprises: forming an active layer, a gate insulating layer, a gate, an interlayer insulating layer, a source, a drain and a first passivation layer on the base substrate; and the step of disposing a stress absorbing unit around the thin film transistor comprises: forming, outside at least one side of the thin film transistor, a via hole in the first passivation layer, the interlayer insulating layer and the gate insulating layer by a patterning process, and forming a resin material in the via hole and on the first passivation layer to form the vertical portion and the horizontal portion of the stress absorbing unit.

14. A manufacturing method according to claim 13, further comprising:
forming a via hole in each layer on the drain, and forming an anode, which is connected to the drain through the via hole, by a patterning process;
forming a pixel defining layer, an organic light-emitting layer and a cathode; and
packaging the display substrate.

15. A manufacturing method according to claim 12, wherein
the step of disposing a thin film transistor on a base substrate comprises: forming an active layer, a gate insulating layer, a gate, an interlayer insulating layer, a source, a drain and a first passivation layer on the base substrate, forming a via hole in the first passivation layer on the drain, and forming an anode, which is electrically connected to the drain through the via hole, by a patterning process; and
the step of disposing a stress absorbing units around the thin film transistor comprises: forming, outside at least one side of the thin film transistor, a via hole in the first passivation layer, the interlayer insulating layer and the gate insulating layer by a patterning process, forming a resin material in the via hole to form the vertical portion of the stress absorbing unit, and forming a resin material on the first passivation layer and the anode to form a pixel defining layer serving as the horizontal portion of the stress absorbing unit.

16. A manufacturing method according to claim 15, further comprising:
forming an organic light-emitting layer and a cathode; and
packaging the display substrate.

17. A flexible display device, comprising the display substrate according to claim 1.

18. A display substrate, comprising: a base substrate and a thin film transistor arranged on the base substrate, wherein the display substrate further comprises a stress absorbing unit disposed around the thin film transistor and spaced apart from the thin film transistor; and the stress absorbing unit comprises a horizontal portion at least located above the thin film transistor, and a vertical portion located outside at least one side of the thin film transistor, wherein the base substrate is provided thereon with a plurality of insulating layers, and
wherein the plurality of insulating layers are a gate insulating layer, an interlayer insulating layer, a first passivation layer, and a planarization layer, sequentially disposed on the base substrate.

19. The display substrate according to claim 18, wherein the horizontal portion is connected with the vertical portion; and the vertical portion is in contact with the base substrate.

20. The display substrate according to claim 18, wherein one of the insulating layers is provided with a via hole; and the vertical portion is arranged in the via hole.

21. The display substrate according to claim 18, wherein more than one of the insulating layers is provided with a via hole; and the vertical portion is arranged in the via hole.

22. The display substrate according to claim 20, wherein the horizontal portion is arranged in a groove of said one of the insulating layers provided with the via hole, or on said one of the insulating layers.

23. The display substrate according to claim 21, wherein the horizontal portion is arranged in a groove of the uppermost insulating layer of said more than one of the insulating layers provided with the via hole, or on the uppermost insulating layer.

24. The display substrate according to claim 22, wherein the horizontal portions of the stress absorbing units around different thin film transistors are connected into a whole.

25. The display substrate according to claim 18, wherein the horizontal portion is arranged in a groove of the planarization layer, or arranged on the planarization layer.

26. The display substrate according to claim 18, further comprising a pixel defining layer located above the thin film transistor, and the pixel defining layer is the horizontal portion.

27. The display substrate according to claim 18, wherein material of the stress absorbing units is a resin material.

28. The display substrate according to claim 27, wherein the resin material is acrylic resin or polyimide resin.

29. A manufacturing method of a display substrate of claim 18, comprising steps of:
disposing a thin film transistor on a base substrate; and
disposing a stress absorbing unit around the thin film transistor and spaced apart from the thin film transistor, so that a horizontal portion of the stress absorbing unit is at least located above the thin film transistor, and a vertical portion of the stress absorbing unit is located outside a side of the thin film transistor.

30. A manufacturing method according to claim 29, wherein
the step of disposing a thin film transistor on a base substrate comprises: forming an active layer, a gate insulating layer, a gate, an interlayer insulating layer, a source, a drain, a first passivation layer and a planarization layer on the base substrate; and
the step of disposing a stress absorbing unit around the thin film transistor comprises: forming, outside at least one side of the thin film transistor, a via hole in the planarization layer, the first passivation layer, the interlayer insulating layer and the gate insulating layer by a patterning process, forming a groove, which is used for accommodating the horizontal portion of the stress absorbing unit and is connected with the via hole, in the planarization layer by a patterning process, and forming a resin material in the via hole and the groove to form the vertical portion and the horizontal portion of the stress absorbing unit; or wherein the step of disposing a thin film transistor on a base substrate comprises: forming an active layer, a gate insulating layer, a gate, an interlayer insulating layer, a source, a drain, a first passivation layer and a planarization layer on the base substrate; and the step of disposing a stress absorbing unit around the thin film transistor comprises: forming, outside at least one side of the thin film transistor, a via hole in the planarization layer, the first passivation layer, the interlayer insulating layer and the gate insulating layer by a patterning process, and forming a resin material in the via hole and on the planarization layer to form the vertical portion and the horizontal portion of the stress absorbing unit.

31. A manufacturing method according to claim 30, further comprising:

forming a via hole in each layer on the drain, and forming an anode, which is connected to the drain through the via hole, by a patterning process;

forming a pixel defining layer, an organic light-emitting layer and a cathode; and packaging the display substrate.

32. A flexible display device, comprising the display substrate according to claim 18.

* * * * *